(12) United States Patent
    Sohn et al.

(10) Patent No.: US 9,633,703 B2
(45) Date of Patent: Apr. 25, 2017

(54) SEMICONDUCTOR MEMORY SENSING ARCHITECTURE

(71) Applicant: Kilopass Technology, Inc., San Jose, CA (US)

(72) Inventors: Jeong-Duk Sohn, San Ramon, CA (US); Steve Wang, Fremont, CA (US); Charlie Cheng, Los Altos, CA (US)

(73) Assignee: Kilopass Technology, Inc., San Jose, CA (US)

( * ) Notice: Subject to any disclaimer, the term of this patent is extended or adjusted under 35 U.S.C. 154(b) by 0 days.

(21) Appl. No.: 15/188,166

(22) Filed: Jun. 21, 2016

(65) Prior Publication Data

US 2017/0011781 A1    Jan. 12, 2017

Related U.S. Application Data

(60) Provisional application No. 62/191,226, filed on Jul. 10, 2015.

(51) Int. Cl.

| G11C 5/14 | (2006.01) |
|---|---|
| G11C 7/06 | (2006.01) |
| G11C 7/22 | (2006.01) |
| G11C 7/12 | (2006.01) |
| G11C 7/10 | (2006.01) |

(52) U.S. Cl.
CPC .............. *G11C 7/065* (2013.01); *G11C 7/106* (2013.01); *G11C 7/12* (2013.01); *G11C 7/22* (2013.01)

(58) Field of Classification Search
CPC ........... G11C 7/065; G11C 7/106; G11C 7/12; G11C 7/22
USPC .............. 365/189.05, 185.13, 185.18, 185.2, 365/185.21, 185.23, 185.25, 189.07, 365/189.09, 210.1
See application file for complete search history.

(56) References Cited

U.S. PATENT DOCUMENTS 7,071,771 B2 *    7/2006    Takano ................ G11C 11/5621
                                                                        327/513

\* cited by examiner

*Primary Examiner* — Fernando Hidalgo
(74) *Attorney, Agent, or Firm* — Aka Chan LLP

(57) ABSTRACT

A circuit arrangement and method of reading the logic state of a memory cell in an array of semiconductor memory cells. A data memory cell selected from the array drives a current on a first data bit line in a read operation. A reference memory cell corresponding to the memory cell is activated after the memory cell is selected, the reference memory cell driving a current through the reference data line at a greater rate than that of the corresponding memory cell regardless of the logic state of the memory cell. A sense amplifier connected to the data line and a reference data line determines the logic state of the selected memory cell. A delay circuit activates the reference memory cell after the memory cell is selected and enables the sense amplifier after the reference memory cell has been activated. The circuit arrangement further has a latch connected to an output of the sense amplifier, the latch capturing the output from the sense amplifier when the sense amplifier determines the logic state of the selected memory cell and sending a signal to the sense amplifier to disable itself.

15 Claims, 3 Drawing Sheets

SEMICONDUCTOR MEMORY SENSING ARCHITECTURE

CROSS-REFERENCE TO RELATED APPLICATIONS

This patent application claims the benefit of U.S. Provisional Patent No. 62/191,226, filed Jul. 10, 2015, which is incorporated by reference along with all other references cited in this application.

BACKGROUND OF THE INVENTION

This invention relates to semiconductor memory devices and, more specifically, to electronic circuits and circuit architectures for sensing the stored logic states of memory cells in such semiconductor devices.

There are many types of semiconductor memory devices, such as SRAM (Static Random Access Memory), DRAM (Dynamic Random Access Memory), ROM (Read-Only Memory), NVRAM (Non-Volatile Random Access Memory), etc. In many, if not most, of these semiconductor memory devices, the logic state of a memory cell stored as a bit of data is sensed or "read" by comparing the current of a bit line connected to the data memory cell against the current of a second bit line connected to a reference memory cell. If the current of the bit line connected to the data memory cell is greater than the current of the second bit line connected to the reference memory cell, then the bit stored by the data memory cell is considered to be a particular value, a logic "1," for example. On the other hand, if the current of the bit line connected to the data memory cell is less than the current of the second bit line connected to the reference memory cell, then the bit stored by the data memory cell is considered to be a logic "0." The comparison with the reference memory cell allows discrimination between the two logic states to determine the bit stored in the data memory cell. Of course, what is considered logic "1" and "0" is arbitrarily defined.

A problem which has become more apparent is that there is significant variability in the characteristics of the elements of the semiconductor devices with the shrinking dimensions of advanced process technologies. For example, in memory devices both the data memory cells and reference memory cells can have a significant range of operating parameters which can cause problems. If the current output of the reference memory cell is set to close to "0" (assuming "0" corresponds to a low bit line current), noise in the ground plane may cause a false sensing of logic "1" in the data memory cell. But if the reference memory cell is set too high, then a data memory cell with a weak bit line current may cause a false sensing of logic "0" when the current of the data memory cell is compared to the current of the reference memory cell.

Hence there is a need for some sensing technique which is suitable for advanced process technologies and adaptable to the variability of device characteristics.

BRIEF SUMMARY OF THE INVENTION

The present invention provides for a circuit arrangement in a semiconductor device having an array of memory cells, each memory cell connected to a data line and driving a current through the data line responsive to the logic state of the memory cell when the memory cell is selected for a read operation. The circuit arrangement comprises: a reference memory cell corresponding to each memory cell, the reference memory cell connected to a reference data line and when activated driving a current through the reference data line at a greater rate than that of the corresponding memory cell regardless of the logic state of the memory cell; a sense amplifier connected to the data line and a reference data line determining the logic state of the selected memory cell; and a delay circuit activating the reference memory cell after a first delay after the memory cell is selected. The delay circuit enables the sense amplifier after a second delay after the reference memory cell has been activated. The circuit arrangement further comprises a latch connected to an output of the sense amplifier, the latch capturing the output from the sense amplifier when the sense amplifier determines the logic state of the selected memory cell and sending a signal to the sense amplifier to disable itself.

The present invention also provides for a method of operation in an array of semiconductor memory cells, each memory cell holding a bit of information, a method of determining the logic state of the bit in a memory cell. The method comprises: selecting a memory cell in the array of semiconductor memory cells, the selected memory cell driving a current through a first data line responsive to the logic state of the memory cell; activating a reference bit cell after the memory cell is selected to drive current through a second data line, the activated reference bit cell driving current through the second data line at a higher rate than the rate of the selected memory cell regardless of the logic state of the memory cell; and enabling a sense amplifier connected to the first and second data lines to determine the state of the selected memory cell relative to the reference memory cell. The sense amplifier enabling step further comprises enabling the sense amplifier after the reference memory cell is activated. Further steps in the method include: latching an output of the sense amplifier after the sense amplifier determines the state of the selected memory cell; and disabling the sense amplifier when the sense amplifier output is latched wherein the sense amplifier no longer draws power.

Other objects, features, and advantages of the present invention will become apparent upon consideration of the following detailed description and the accompanying drawings, in which like reference designations represent like features throughout the figures.

DETAILED DESCRIPTION OF THE INVENTION

In many memory designs, a sense amplifier compares two inputs from a data memory cell and a reference memory cell to decide whether the data memory bit cell holds, or is in, a logic "0" or a logic "1" state. It is desirable that this read operation be performed as quickly as possible and with as little power consumed as possible. But in advanced process technologies there is significant variability in the parameters of the elements of the integrated circuit. The reference memory cell(s) and data memory cells in an integrated circuit can exhibit a significant variation with a range of operational values, such as the values of the current output values from the memory cells. If the current output of the reference bit cell is set too close for a "0" reading, the noise in the ground plane could cause a false sensing of "1" in the data memory cell. This is, even if the data memory cell is holding a "0," the sense amplifier senses a "1" compared to the putative "0" in the reference memory cell. On the other hand, if the current output of the reference bit cell is set too high, close to a reading of "1," then a data memory cell with a weak bit cell current could cause a false sensing of "0." The reference memory cell is too strong for the data memory cell and the sense amplifier reads a "0" for the data memory cell.

Figure 1:
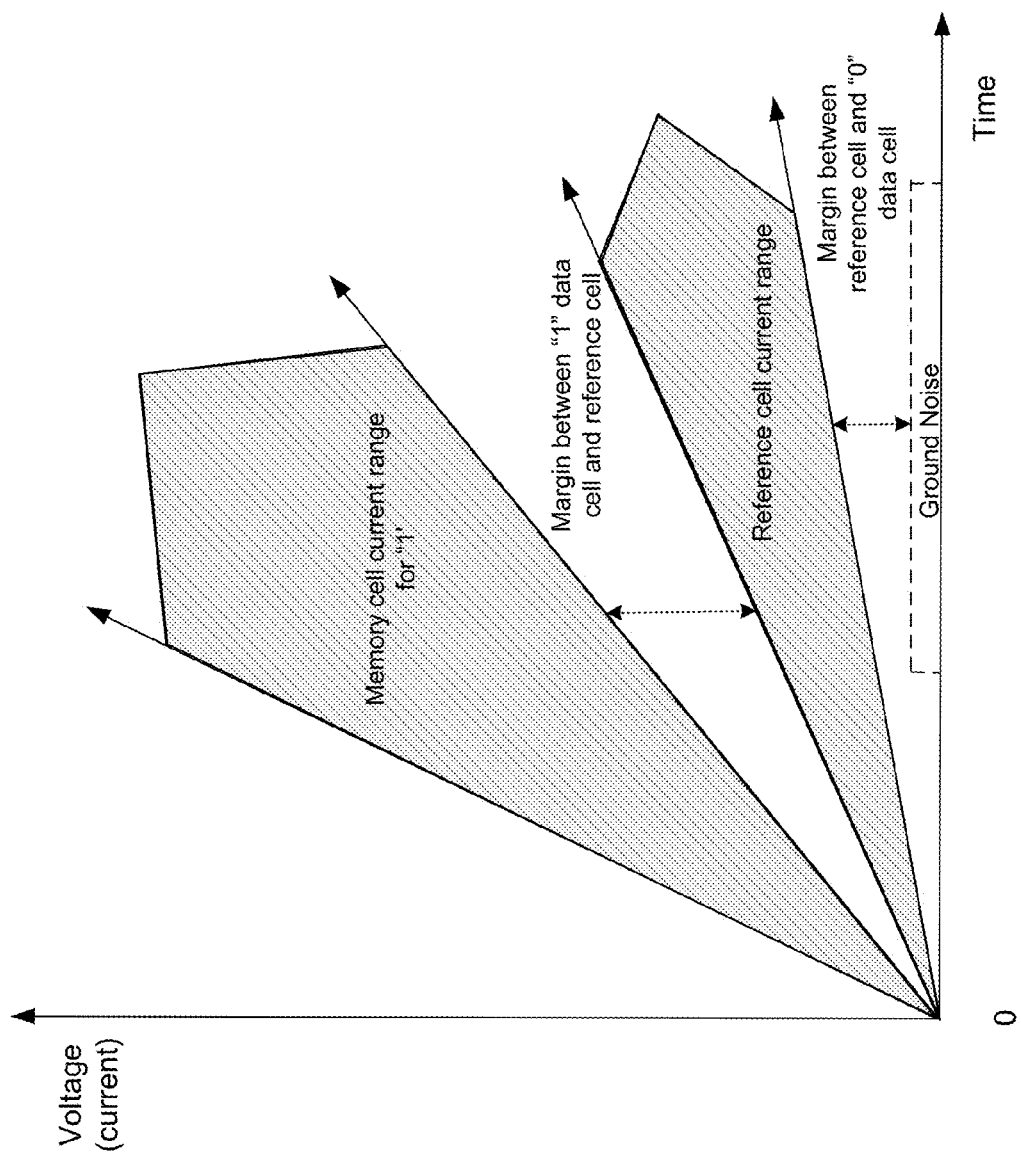
FIG. 1 is a graphical representation of the problems of conventional differential sensing of memory cells in integrated circuits manufactured with advanced process technologies.

The difficulty of differential sensing with advanced processes having high variability is shown by the graphical representations of FIG. 1. In the conventional operation of a differential sense amplifier, a data memory cell is selected by placing address bits in the decoders of the memory array, connecting the data memory cell to a bit line and setting the nodes of the data memory cell for a read operation. For example, if the memory cells are static RAM cells with power supply terminals, the voltage difference between the power supply nodes are typically increased for the read operation compared to the voltage difference during standby mode in which the memory cells maintain their contents at a minimum amount of power. The increase in voltage difference allows a memory cell which is turned ON, representing a "1," for example, to more strongly drive current through the connected bit line. A memory cell which is OFF, representing a "0" in this example, does not drive, or drives little, current through the bit line.

Both the data memory cell and reference memory cell start at the same time, here shown as time 0. If the data memory cell holds a "0," then the cell remains OFF and the current (except for some leakage current) through the connected bit line remains 0. If the data memory cell holds a "1," then the cell drives current strongly through the connected bit line to quickly raise its voltage. "Strongly" is compared to the rate at which the reference memory cell drives current through its bit line. Ideally the reference memory cell drives a current intermediate in magnitude between the current magnitude of the data memory cell at "1" and at "0." Reference loads on the data and reference bit lines translate the bit line currents into bit line voltages.

FIG. 1 shows how the data memory cell holding a "1" rises more quickly from initial time denoted by "0" than the reference memory cell in conventional differential sensing. The drawing also illustrates that the variability of the rates at which the data memory cell and reference memory cell rises due to process variations. The shaded regions indicate the range of possible rates due to the variations. As shown in FIG. 1, there are margins between the ranges of the data memory cells and the reference memory cell(s) which increase with time. The margins indicate that the sense amplifier should be able to distinguish between the stored bits in the data memory cell and the reference memory cell. However, with increasing variations the shaded regions become larger and the margins become narrower. When the margins disappear, it becomes problematical for the logic state of the data memory cell to be determined as described in the examples above.

New Sensing Architecture

Figure 2:
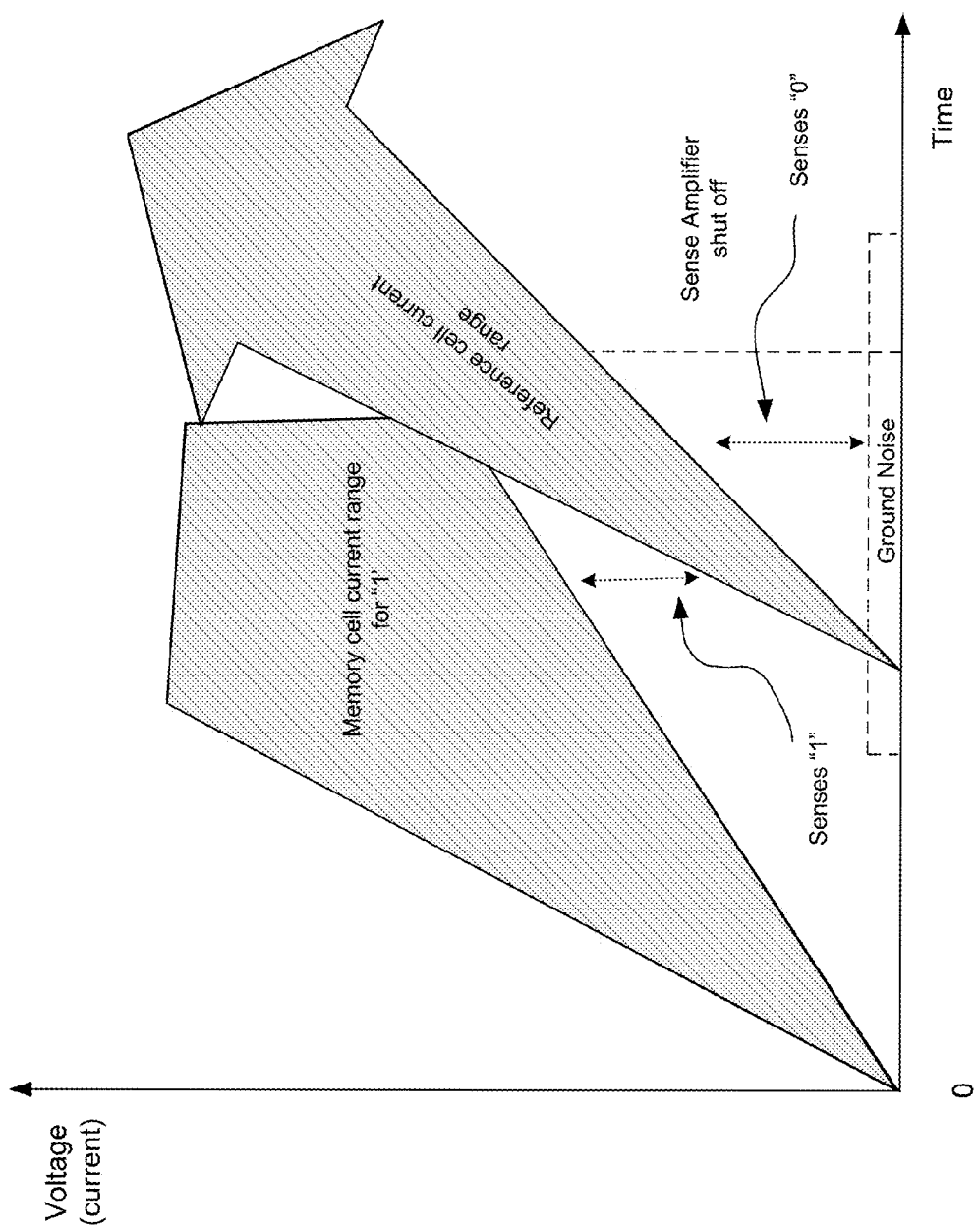
FIG. 2 illustrates the general operation of a sensing memory architecture in accordance with an embodiment of the present invention.

To overcome these problems, the present invention provides for a new sensing architecture to read the logic state of a memory cell. Rather than starting the reference memory cell at the same time as the selected data memory cell, the activation of the reference memory cell is delayed while the data memory cell is selected and allowed to develop its value. Furthermore, the activated reference memory cell drives its reference bit line at a rate greater than that of a data memory cell with a logic "1." Then the sense amplifier is enabled. The rate is large enough to reach beyond the ground noise level before the sense amplifier is ready to sense the differential voltages between the data and reference memory cells, thus avoiding a false reading of "1" for the data memory cell. If the data memory cell holds a "1," the cell's bit line current/voltage should have already reached a high value even if the cell is weak by the time the sense amplifier is engaged. Of course, if the data memory cell holds a "0," reference memory cell with its fast rate ensures that the sense amplifier correctly determines a logic 0 for the data memory cell. As soon as the sense amplifier latches the sensed value of the data memory cell, the sense amplifier is then shut off to avoid the crossover to cause a false reading of "0," and to save power. The description above is represented in FIG. 2.

Figure 3A:
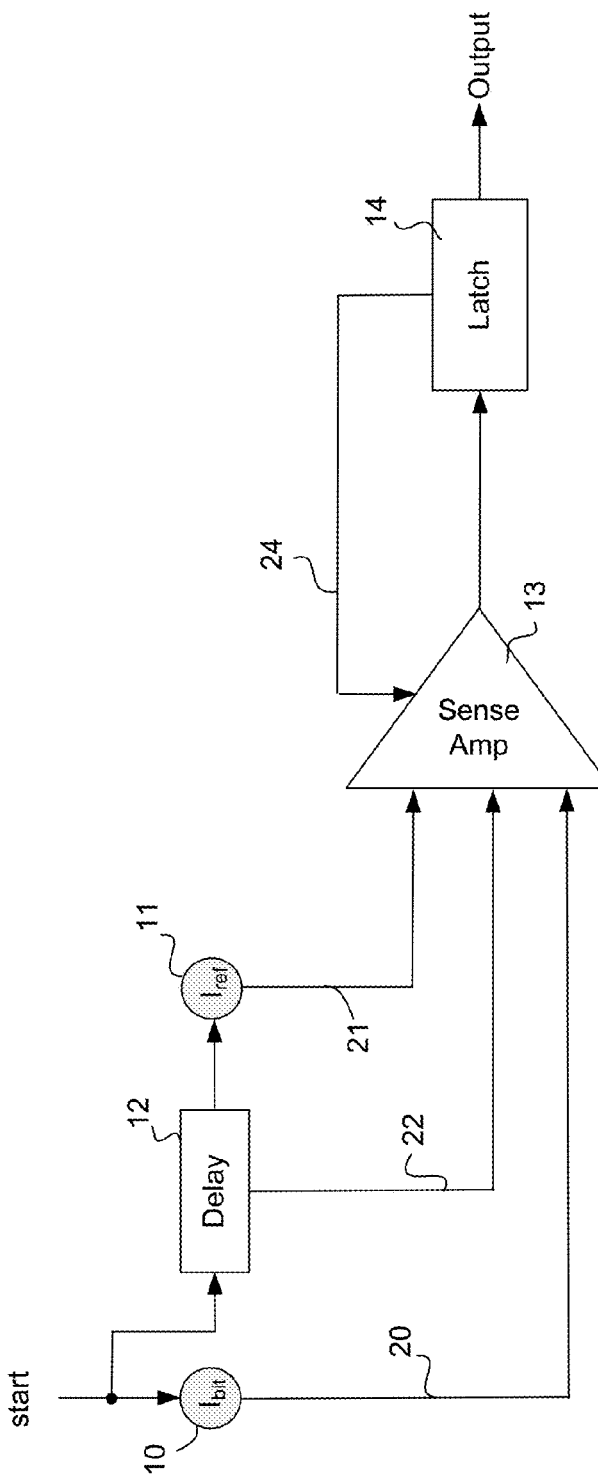
FIG. 3A shows a representational block diagram of one embodiment of the sensing memory architecture.

FIG. 3A shows a circuit diagram of a sensing architecture according to one embodiment of the present invention. For simplicity and ease of explanation, only one data memory cell of a memory cell array is shown and represented by a data bit current source 10 which is connected to a bit line 20. A reference memory cell corresponding to the data memory cell is represented by a reference bit current source 11 which is connected to a reference bit line 21. The term, "current source," is used broadly and can also include current sinks. Both the data bit line 20 and the reference bit line 21 are connected to input terminals of a sense amplifier 13 whose output is received by a latch 14. The sense amplifier 13 is enabled (turned on) by a signal from a delay circuit 12 through a control signal line 22 and disabled (turned off) by a signal from the latch 14 through a control signal line 24.

As explained earlier, the reference memory cell drives its bit line 21 at a much greater rate than the bit line 20 if its data memory cell 10 were in a "1" state. This higher rate can be achieved by designing the reference memory cell 11 to be larger than its corresponding data memory cell(s), or by creating a large reference memory cell out of many smaller memory cells, say, the size of a data memory cell. Even if the reference memory cell is supposedly programmed to be in a state intermediate that of "0" and "1," the current from the cell's effective larger size drives its bit line at a greater rate. Alternatively, the reference memory cell could be programmed to a state greater than "1" or a combination of increased physical size and non-intermediate state programming.

The data bit current source 10 represents the selected data memory cell and the various lines and circuits which are connected the memory cell for activating the data memory cell for a read operation. The "start" signal represents the selection of the data memory cell for a read operation. With the read operation of the data memory cell, a delay is initiated by the delay circuit 12 and after an interval D by the delay circuit 12, the reference memory cell 11 is activated. The reference memory cell is activated when the reference memory cell is connected to a bit line and the nodes of the reference memory cell are set for the read operation. Shortly thereafter by an interval tr, the sense amplifier 13 is enabled.

Figure 3B:
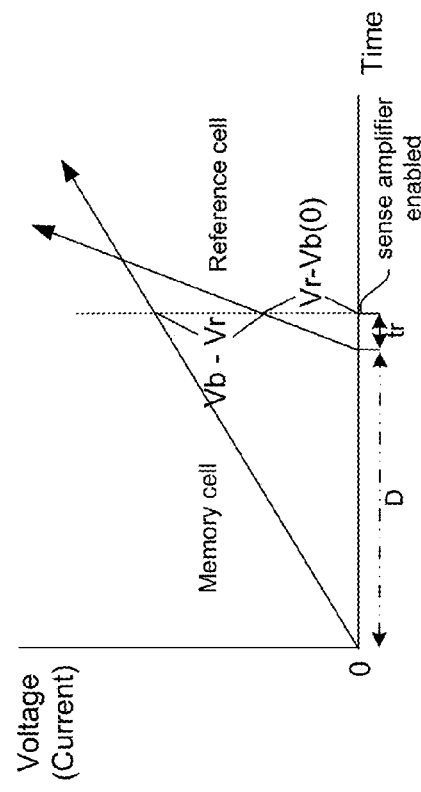
FIG. 3B illustrates the timing relationships of the elements in the FIG. 3A circuit.

The timing of operations is more explicitly illustrated in FIG. 3B. Assuming that the data memory cell represented by the bit current source 10 is selected and activated at time 0, its corresponding reference memory cell represented by reference current source 11 is activated at a time interval D later. Thereafter by a time interval tr, the sense amplifier 13 is enabled and starts following the difference between the voltages (currents) on the two bit lines 20 and 21. When the difference is sufficiently large, the sense amplifier 13 trips into one state or another at which point the latch 14 captures that state and "latches." Upon latching, the latch 14 sends a signal on line 24 back to the sense amplifier 13 to disable and turn the amplifier off. The possibility of the reference bit line voltage exceeding the data memory cell bit line voltage is avoided. The latch 14 holds the captured state read from the selected memory cell.

Some circuit operational conditions provide numerical constraints given a process technology and its resulting variations:

One is that $V_r(D+tr)-V_b(0)\gg$ground noise. The difference between the reference bit line voltage when the sense amplifier is enabled, i.e., time D+tr, and the data bit line voltage with the data memory cell holding a "0", i.e., the reference bit line voltage, should be much larger than ground noise. This allows the sense amplifier to clearly distinguish that a logic 0 is stored in the data memory cell. Some representative values for a process technology having a critical dimension of 55 nm are: $D\approx 3$ ns; $tr\approx 1$ ns; $V_r(D+tr)-V_b(0)$ 300 mV and ground noise 150 mV.

A second constraint is $V_b(D+tr)-V_r(D+tr)\gg V_{SA\_offset}$. When the sense amplifier is enabled (time D+tr), the difference between voltages on the data bit line voltage and the reference bit line voltage should be much larger than the sense amplifier offset voltage, the voltage at which the sense amplifier "trips." This constraint ensures that the time the sense amplifier is enabled, the reference bit line voltage has not overtaken the data bit line voltage. Some representative values for current process technologies are: $V_b(D+tr)-V_r(D+tr)\approx 200$ mV and $V_{SA\_offset}\approx 50$ mV.

The described arrangement increases the margin for process variability, according to one embodiment of the present invention. By delaying the operation of the sense amplifier, the arrangement allows even the weakest "1" bit cell to reach a sufficiently high voltage. By raising the slope of the reference bit cell current, the sense amplifier escapes the ill effects of ground noise level much faster. There are better sensing margin for "1" and "0" bits in the data memory cells. The arrangement also has the benefit of reducing power, since the sense amplifier is only open for a fraction of the time. Lastly, the scheme shuts off the sense amplifier as soon as "1" latches to avoid the crossover of the reference bit line.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. In a semiconductor device having an array of memory cells, each memory cell connected to a data line and driving a current through the data line responsive to the logic state of the memory cell when the memory cell is selected for a read operation, a circuit arrangement comprising:
   a reference memory cell corresponding to each memory cell, the reference memory cell connected to a reference data line and when activated driving a current through the reference data line at a greater rate than that of the corresponding memory cell regardless of the logic state of the memory cell;
   a sense amplifier connected to the data line and a reference data line determining the logic state of the selected memory cell; and
   a delay circuit activating the reference memory cell after the memory cell is selected.

2. The circuit arrangement of claim 1 wherein the delay circuit enables the sense amplifier after the reference memory cell has been activated.

3. The circuit arrangement of claim 1 further comprising a latch connected to an output of the sense amplifier, the latch capturing the output from the sense amplifier when the sense amplifier determines the logic state of the selected memory cell and sending a signal to the sense amplifier to disable itself.

4. The circuit arrangement of claim 1 wherein the reference memory cell is larger than its corresponding memory cell so as to drive a current through the reference data line at a greater rate than that of the corresponding memory cell regardless of the logic state of the memory cell.

5. The circuit arrangement of claim 1 wherein the reference memory cell comprises a plurality of smaller reference memory cells connected so as to drive a current through the reference data line at a greater rate than that of the corresponding memory cell regardless of the logic state of the memory cell.

6. The circuit arrangement of claim 2 wherein the delay circuit enables the sense amplifier when the difference between the reference bit line voltage and the data bit line voltage with the logic state "0" of the data memory cell is much larger than ground noise.

7. The circuit arrangement of claim 6 wherein the delay circuit enables the sense amplifier when the difference between voltages on the data bit line voltage and the reference bit line voltage is much larger than the voltage at which the sense amplifier trips into one state or another.

8. The circuit arrangement of claim 2 wherein the delay circuit enables the sense amplifier when the difference between voltages on the data bit line voltage and the reference bit line voltage is much larger than the voltage at which the sense amplifier trips into one state or another.

9. In an array of semiconductor memory cells, each memory cell holding a bit of information, a method of determining the logic state of the bit in a memory cell, the method comprising:
   selecting a memory cell in the array of semiconductor memory cells to drive current through a first data line responsive to the logic state of the memory cell;
   activating a reference bit cell after the memory cell is selected to drive current through a second data line, the activated reference memory cell driving current through the second data line at a higher rate than the rate of the selected memory cell regardless of the logic state of the memory cell; and
   enabling a sense amplifier connected to the first and second data lines to determine the state of the selected memory cell relative to the reference memory cell.

10. The method of claim 9 wherein the sense amplifier enabling step further comprises enabling the sense amplifier after the reference bit cell is activated.

11. The method of claim 9 further comprising:
    latching an output of the sense amplifier after the sense amplifier determines the state of the selected memory cell.

12. The method of claim 11 further comprising:

disabling the sense amplifier when the sense amplifier output is latched wherein the sense amplifier no longer draws power.

13. The method of claim 9 wherein the sense amplifier enabling step comprises enabling the sense amplifier when the difference between the reference bit line voltage and the data bit line voltage with the logic state "0" of the data memory cell is much larger than ground noise.

14. The method of claim 13 wherein the sense amplifier enabling step comprises enabling the sense amplifier when the difference between voltages on the data bit line voltage and the reference bit line voltage is much larger than the voltage at which the sense amplifier trips into one state or another.

15. The method of claim 9 wherein the sense amplifier enabling step comprises enabling the sense amplifier when the difference between voltages on the data bit line voltage and the reference bit line voltage is much larger than the voltage at which the sense amplifier trips into one state or another.

\* \* \* \* \*